(12) United States Patent
Yokoo

(10) Patent No.: US 7,709,953 B2
(45) Date of Patent: May 4, 2010

(54) SEMICONDUCTOR DEVICE

(75) Inventor: Satoshi Yokoo, Ota (JP)

(73) Assignees: Sony Electric Co., Ltd., Osaka (JP); Sanyo Semiconductor Co., Ltd., Gunma (JP)

(*) Notice: Subject to any disclaimer, the term of this patent is extended or adjusted under 35 U.S.C. 154(b) by 0 days.

(21) Appl. No.: 12/341,714

(22) Filed: Dec. 22, 2008

(65) Prior Publication Data

US 2009/0174066 A1 Jul. 9, 2009

(30) Foreign Application Priority Data

Dec. 25, 2007 (JP) ............................. 2007-333000

(51) Int. Cl.
H01L 23/34 (2006.01)
(52) U.S. Cl. ...................... 257/724; 257/723
(58) Field of Classification Search ................ 257/691, 257/723, 724, 686
See application file for complete search history.

(56) References Cited

U.S. PATENT DOCUMENTS 6,137,165 A * 10/2000 Thierry ........................ 257/690
6,630,731 B2 * 10/2003 Miyamoto et al. .......... 257/686
2009/0141133 A1 * 6/2009 Watanabe et al. ......... 348/208.6
2009/0141136 A1 * 6/2009 Watanabe ............... 348/208.99
2009/0141137 A1 * 6/2009 Watanabe et al. ...... 348/208.99

FOREIGN PATENT DOCUMENTS

| JP | 7-23277 | 1/1995 |
| JP | 11-187308 | 7/1999 |
| JP | 2002-57270 | 2/2002 |

OTHER PUBLICATIONS esp@cenet patent abstract for Japanese Publication No. 2002057270, Publication date Feb. 22, 2002 (1 page).
esp@cenet patent abstract for Japanese Publication No. 7023277, Publication date Jan. 24, 1995 (1 page).
esp@cenet patent abstract for Japanese Publication No. 11187308, Publication date Jul. 9, 1999 (1 page).

* cited by examiner

Primary Examiner—S. V Clark
(74) Attorney, Agent, or Firm—Osha • Liang LLP

(57) ABSTRACT

In a multi-chip package semiconductor device, a drive chip having an analog circuit and a logic chip having a digital circuit are mounted within the same package. The driver chip includes a logic-chip power-supply circuit that makes up a logic-chip power supply for the logic chip and a group of operational amplifiers that amplify detection signals from a plurality of sensors. The driver chip has the shape of a square as a whole, and the plurality of operational amplifiers and the logic-chip power-supply circuit are disposed in diagonally opposed positions.

5 Claims, 5 Drawing Sheets

SEMICONDUCTOR DEVICE

CROSS-REFERENCE TO RELATED APPLICATION

The disclosure of Japanese Patent Application No. 2007-333000 filed on Dec. 25, 2007, including specification, claims, drawings, and abstract, is incorporated herein by reference in its entirety.

BACKGROUND OF THE INVENTION

1. Field of the Invention

The present invention relates to a multi-chip package semiconductor device in which a drive chip having an analog circuit and a logic chip having a digital circuit are mounted within the same package.

2. Description of the Related Art

A digital circuit that performs logical processing of digital data is usually voltage-driven and is composed of many small transistors that are on-off driven. It is difficult to incorporate a power-supply circuit having current driving capabilities sufficient for driving a digital circuit into a digital-circuit chip.

For this reason, in the case of a logic chip in which digital circuits are integrated, a power supply necessary for the logic chip is often fabricated as a power-supply circuit by using bipolar transistors formed from a different chip to that of the logic chip.

For example, Japanese Patent Laid-Open Publication No. 2002-57270 discloses a semiconductor device having a plurality of chips with different power supplies. This semiconductor device is such that in each of the chips, power is received from separate power supplies through power-supply circuits that are not diagrammatically shown.

Examples of documents describing the related art include Japanese Patent Laid-Open Publication No. Hei 7-23277 and Japanese Patent Laid-Open Publication No. Hei 11-187308.

A logic circuit performs various kinds of logical operations on the basis of a clock of relatively high frequency. Therefore, these operations basically involve turning on and off transistors that are connected to a power line and a ground line, thereby setting a signal line at H-level or L-level. Therefore, switching noise is apt to be superposed on signals of the power line and ground line of a logic circuit. On the other hand, an analogue circuit is provided with an operational amplifier that amplifies detection signals of a hole sensor, a gyro sensor and the like. These detection signals are very small signals, and hence the effect of noise should be eliminated as much as possible. That is, if switching noise is superposed on signals of the power line and ground line, the effect of this switching noise manifests itself in the output of the operational amplifier, and amplified signals of the noise are included in the amplified signals of the micro detection signals.

SUMMARY OF THE INVENTION

According to the present invention, an operational amplifier for a sensor is disposed in the vicinity of one corner of a driver chip, and a power-supply circuit for a logic chip is disposed at a corner opposed to this corner. Therefore, even if noise superposed on signals of a power line of the logic chip is transmitted to a line inside the driver chip, the noise has little effect on the operational amplifier for a sensor.

DESCRIPTION OF THE PREFERRED EMBODIMENT

An embodiment of the present invention will be described below on the basis of the drawings.

Figure 4:
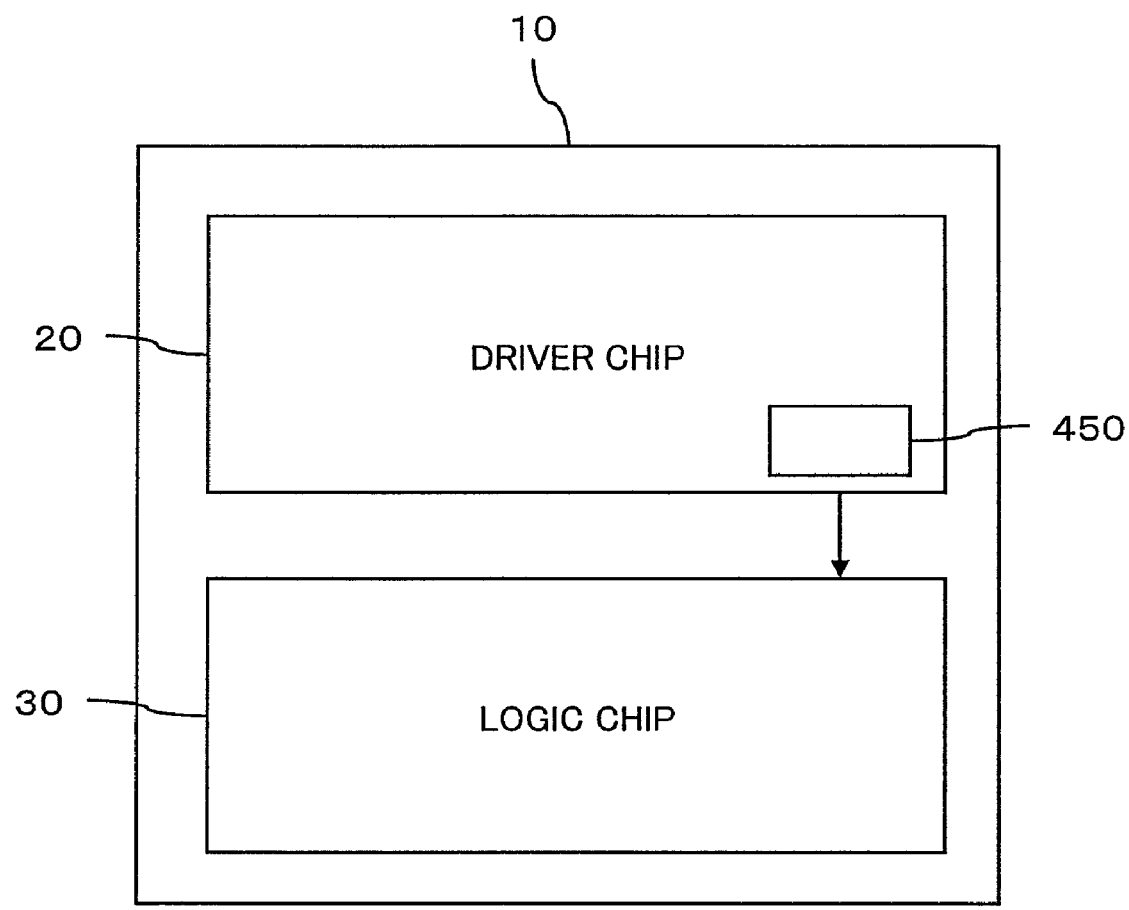
FIG. 4 is an explanatory diagram showing an outline of the arrangement of a driver chip 20.

FIG. 4 shows a schematic circuit configuration of a multi-chip package (MCP) semiconductor device related to the present embodiment. In this semiconductor device (multi-chip package) 10, a driver chip 20 having an analog circuit and a logic chip 30 having a digital circuit 30 are packaged by being mounted on a common substrate. In this embodiment, this semiconductor device can perform processing for realizing a vibration-reduction function adopted in cameras and the like, i.e., what is called the camera shake correcting function. As a matter of course, although the MCP of the present invention is not limited to a semiconductor device for vibration-damping devices, in this embodiment descriptions will be given by taking this semiconductor device for vibration-damping devices as an example.

In imaging equipment, such as a video camcorder or a digital still camera, it is required that photographed images be prevented from being degraded due to the occurrence of blurring in a subject caused by vibrations and the like such as camera shake, and hence imaging equipment is provided with a vibration-reduction function. This vibration-reduction function can be realized by a method that involves detecting vibrations of imaging equipment with respect to a subject and making a shift correction to an imaging device, such as an optical system (a lens) or a CCD depending on the direction of vibrations, by use of a motor, using a method that involves correcting video data etc.

In the execution of vibration detection using a sensor, such as a gyro sensor, and the driving control of a motor by a correction signal found from detected vibrations, it is necessary to handle analog signals, and this execution is therefore performed by the driver chip 20 having an analog circuit in which at least some bipolar transistors are used. On the other hand, in order to find a correction signal on the basis of detected vibrations, it is preferable to perform the logical operations of a digital signal that is obtained by the A/D conversion of a signal detected by a sensor, and this corrected data processing is executed by a logic chip 30 having a digital circuit.

Figure 5:
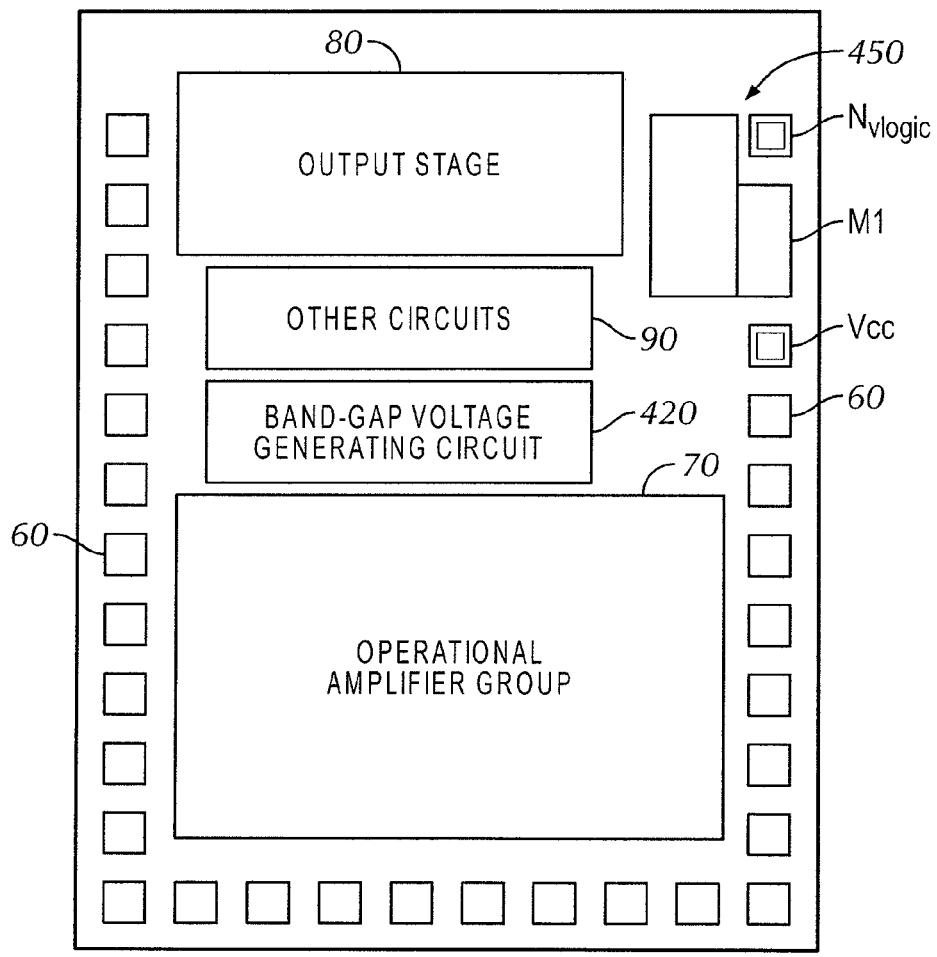
FIG. 5 is an explanatory diagram showing an outline of the multi-chip package 10.

FIG. 5 shows a schematic plan view of the driver chip 20 on which analog circuits are mounted. A plurality of pads (terminals) 60 are provided in the peripheral portion of this driver chip 20. An operational amplifier group 70, a band-gap type constant-voltage circuit 420, an output stage 80, other circuits 90, and a logic-chip power-supply circuit 450 are provided within the driver chip 20.

The pads 60 are used for the input and output of signals and a power-supply voltage. The operational amplifier group 70 is formed from a large number of operational amplifiers, and this operational amplifier group 70 amplifies signals inputted from the pads 60 and signals generated within the driver chip 20. For example, a plurality of hole amplifiers that amplify detection signals of hole elements connected externally are formed by the operational amplifier group 70. The band-gap constant-voltage circuit 420 generates a reference voltage that does not change even if temperature and power-supply voltage Vcc change, as will be described later. The output stage 80 includes an amplifier that generates a driving current of a voice coil for driving an optical system. Other circuits 90 include a Vcc low-voltage cut circuit that performs the processing to be performed when the power-supply voltage Vcc drops, and an overheat protection circuit that performs a protective action during heating. The logic-chip power-supply circuit 450 buffers the reference voltage from the band-gap constant-voltage circuit 420, and supplies power to the logic chip 30 as a power supply having a sufficient current capacity. A pad that is adjacent to an upper part of the logic-chip power-supply circuit 450 as seen in the figure provides an output node $N_{Vlogic}$ of the logic power supply.

In this embodiment, the logic-chip power-supply circuit 450 is disposed in an upper right part of the driver chip 20, as seen in the figure, and the operational amplifier group 70 is disposed in a lower part of the driver chip 20, as seen in the figure. Particularly, a hole amplifier that amplifies micro detection signals and the like is disposed in a lower left part of the driver chip 20, as seen in the figure, as much as possible. By disposing the logic-chip power-supply circuit 450 and the amplifier that amplifies detection signals of the sensor at diagonally opposed positions of the driver chip 20 like this, the distance between the two increases. The logic power supply from the logic-chip power-supply circuit 450 is supplied to the logic chip 30 as the power source thereof. Therefore, according to the switching action of the logic circuit between H-level and L-level, high-frequency noise based on the operating frequency of the logic circuit is apt to be superposed, and noise is also apt to be superposed on signals of the power line and ground line of this logic-chip power-supply circuit 450.

In this embodiment, the logic-chip power-supply circuit 450 and the amplifier for sensor detection signals are disposed at the farthest distance from each other on the driver chip 20. Therefore, even when noise is superposed on signals of the power line and ground line, it is possible to suppress the effect of this noise on the amplifier for sensor detection signals.

The band-gap constant-voltage circuit 420 is disposed between the operational amplifier group 70 (the amplifier of the sensor detection signals and the like) and the logic-chip power-supply circuit 450. It is therefore possible to effectively perform both the supply of the reference voltage to the logic-chip power-supply circuit 450 and the supply of the reference voltage to the operational amplifier group 70.

Figure 1:
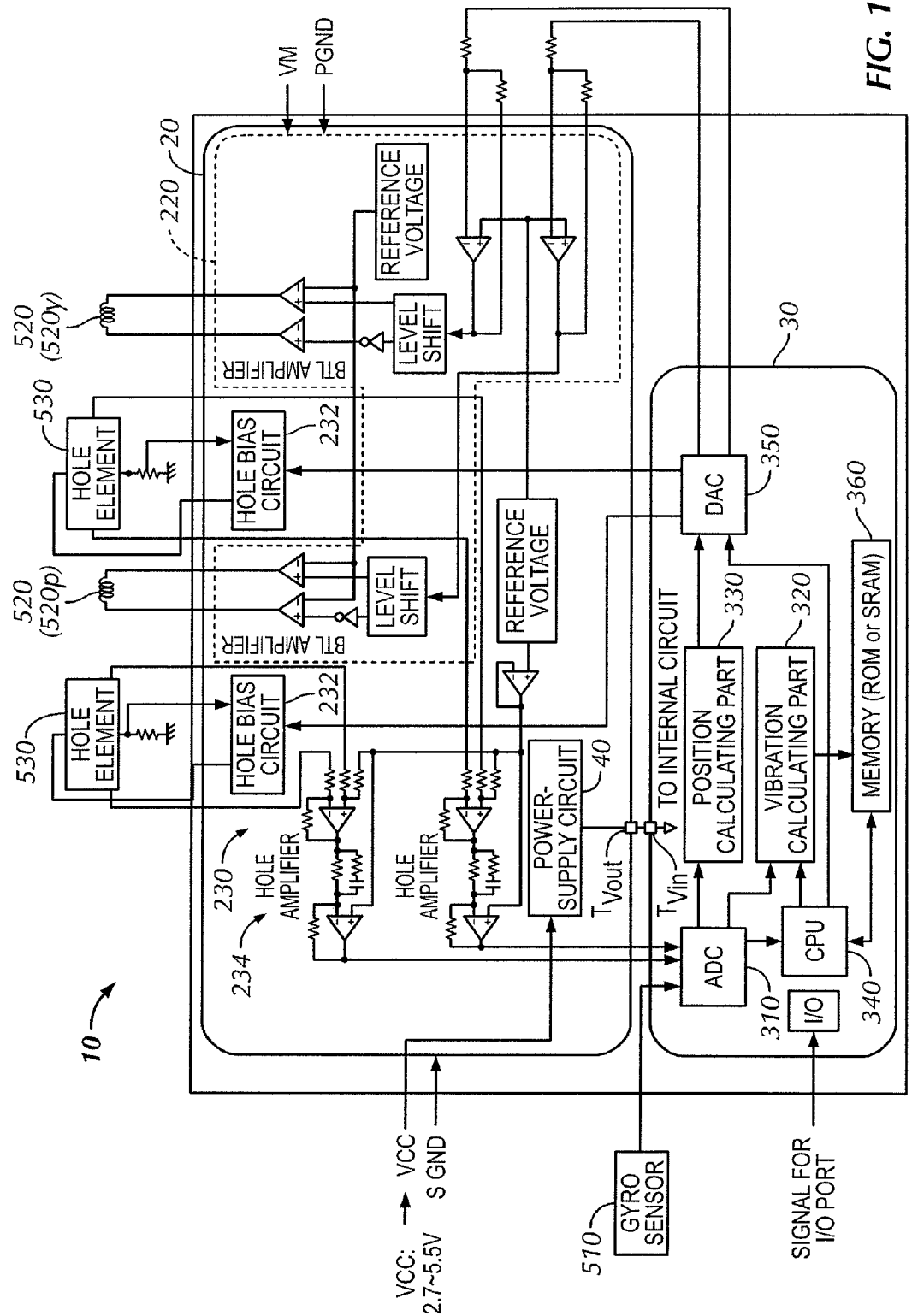
FIG. 1 is a diagram showing an example of a schematic circuit configuration of a multi-chip package related to an embodiment of the present invention.

FIG. 1 shows an example of the configuration of the driver chip 20 and the logic chip 30. FIG. 1 shows the nature of the circuits, and each element is arranged in such a manner as to facilitate the explanation of the circuits.

In FIG. 1, a gyro sensor 510 mounted externally to the MCP 10 detects vibrations and amplifies detected signals. The amplified signals are supplied to the logic chip 30 as vibration detection signals, which are used in the calculation of correction amounts.

Correction signals responsive to the vibrations found in the logic chip 30 are supplied to the correction analog circuit 220 of the driver chip 20. In the example of FIG. 1, vibration corrections are made by using a voice coil motor (VCM) 520 mounted externally to the MCP 10 and the like, and corrections are made by adjusting the lens position so as to cancel the shift of the imaging devices with respect to a subject due to vibrations. The VCM 520 (520 p, 520 y) is provided in the pitch direction and the yaw direction so as to be able to shift the lens position in the pitch direction and the yaw direction. The correction analog circuit 220 has a circuit that drives the coil of the VCM 520 in a BTL (bridged transformerless) manner. Concretely, after the shifting of a correction signal to a desired level, the signal is amplified by the BTL amplifier and supplied to the VCM coil, and the VCM 520 is driven.

The lens position is detected by driving hole elements 530 mounted externally to the MCP 10, and a hole-element analog circuit 230 of the driver chip 20 has a bias circuit 232 that applies a bias voltage to the hole elements 530 and hole amplifiers 234 that prepare position detection signals by amplifying signals obtained from the hole elements 530. Incidentally, the position detection signals are supplied to the logic chip 30 and used in the feedback of the lens driving by the above-described VCM 520.

The logic chip 30 has an analog-digital conversion circuit (ADC) 310 that converts analog signals, such as vibration detection signals obtained from the gyro sensor 510 and position detection signals obtained from the hole amplifier 234, to digital signals. The logic chip 30 also has a vibration calculation part 320 that finds vibration amounts from vibration detection signals, a position calculation part 330 that finds position control signals for correction from position detection signals and vibration amounts, and a control part (CPU) 340 for controlling the calculation parts 320, 330. Furthermore, the logic chip 30 has a digital-analog conversion circuit (DAC) 350 for converting obtained position control signals to analog signals and supplying the analog signals to the driver chip 20. Also, a memory part 360 for storing necessary data during calculation, such as ROM and SRAM, an external input/output circuit (I/O cell) 370 and the like are integrated within the chip.

In the logic chip 30, the I/O cell 370 operates on 3.3 V supplied from an external power-supply circuit. In this embodiment, for the internal logic circuit (vibration calculation part 320, position calculation part 330, CPU 340 and the like), however, operates on 1.2 V.

The logic chip 30, which is a digital circuit using CMOS transistors and the like, requires a step-down circuit with a large area in order to obtain 1.2 V from the 3.3 V supplied from this external power supply. In addition, it is impossible to make up a power supply having a sufficient current supply capacity from CMOS transistors alone. In this embodiment, the power supply used in the logic chip 30 (a 1.2-V power supply) is prepared within the above-described driver chip 20, which is packaged along with this logic chip 30 without using a dedicated power supply circuit chip.

As described above, the driver chip 20 uses the vibration correction analog circuit 220, the hole-element analog circuit 230 and the like, which are provided with bipolar transistors and the like. Therefore, during the formation of these analog circuits, stable power-supply circuits in which band-gap constant-voltage circuits and the like are used can be integrated on the same semiconductor substrate.

Figure 2:
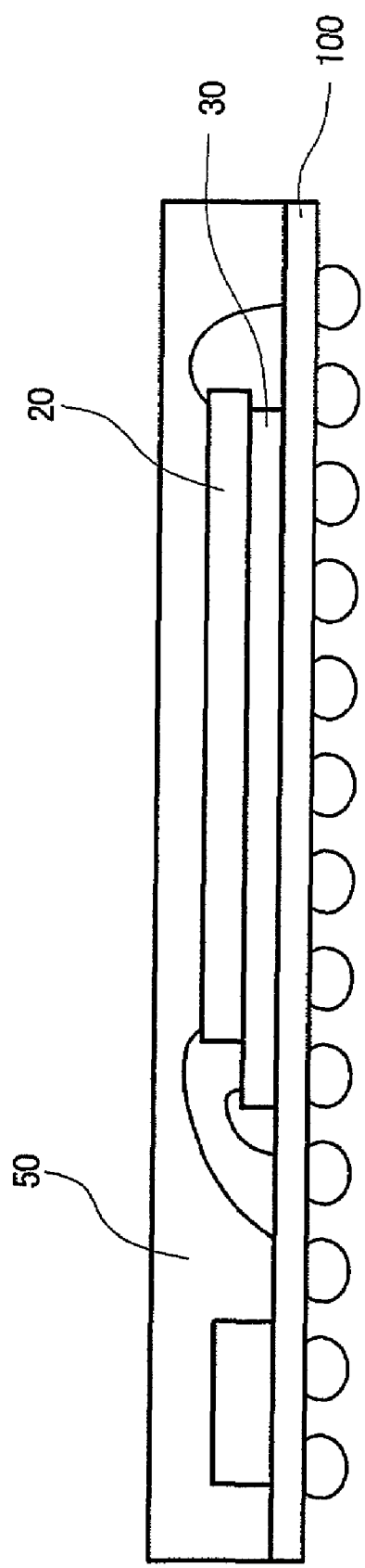
FIG. 2 is an explanatory diagram showing an outline of a multi-chip package 10.

As shown in FIG. 2, the driver chip 20 and the logic chip 30 are packaged within one package on a substrate 100 for the common package by using a molding material 50 of resin or the like. Incidentally, in the example of FIG. 2, these two chips are such that the driver chip 20 is stacked on the logic chip 30 mounted on the substrate 100, and the molding material 50 is disposed so as to cover the whole of these chips. The chips are not limited to the stacking type and may also be disposed side by side in a horizontal direction. Although a core substrate may be adopted as the substrate 100, it is possible to adopt a packaging method by which chips are directly mounted on a wiring pattern film to ensure higher-density, thinner mounting. Furthermore, the number of chips packaged is not limited to 2, and other chips may also be packaged together as required. Because in the MCP 10 different chips are packaged as a unit like this, it is possible to shorten the terminal-to terminal distance to a great extent and it is possible to supply 1.2 V from the driver chip 20 to the logic chip 30 with small power loss. Incidentally, a bi-CMOS type chip provided with both a bipolar transistor and a MOS transistor is adopted as the driver chip 20.

According to this embodiment, in this driver chip 20, there is provided a logic-chip power-supply circuit 40 that is unnecessary in the driver chip 20. This power-supply circuit 40 is composed of a band-gap constant-voltage circuit 420 that generates a reference voltage on the basis of Vcc (2.7 V to 5.5 V) supplied from a power-supply device, which is not shown, and a logic-chip power-supply circuit 450 that buffers the reference voltage, and provides a power supply of a voltage (1.2 V in this case) different from Vcc, which is required by the logic chip 30, from this logic-chip power-supply circuit 450.

Figure 3:
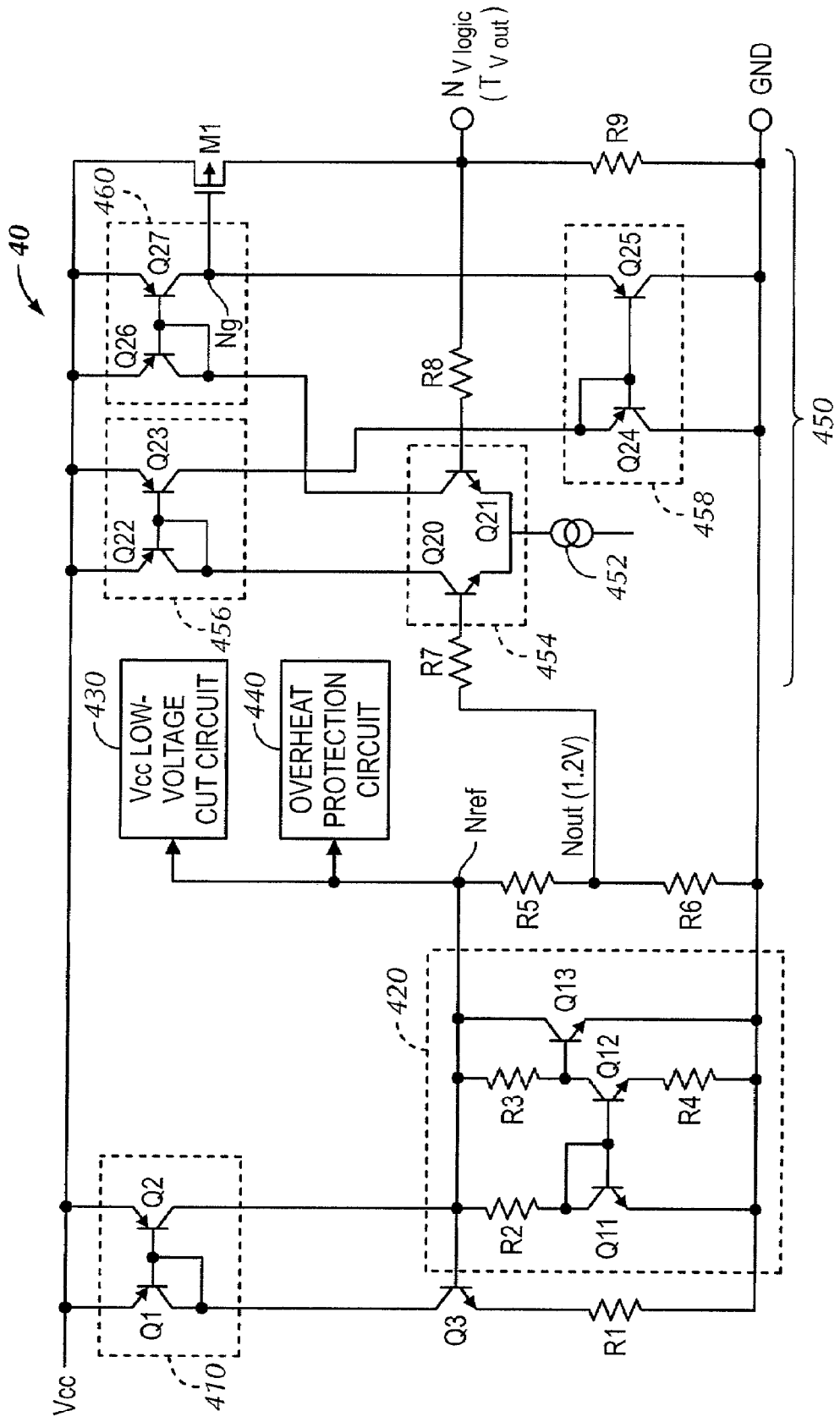
FIG. 3 is a diagram showing an example of a circuit configuration of a power-supply circuit 40 for a logic chip.

FIG. 3 shows an example of a schematic circuit configuration of the 1.2-V power-supply circuit (logic-chip power-supply circuit) 40 formed within the driver chip 20.

Vcc (2.7 V to 5.5 V or so depending on the requirement) is supplied from a power-supply circuit of a device that is external to the driver chip 20, as the operating power supply of this driver chip 20. The logic-chip power-supply circuit 40 of FIG. 3 is provided with the band-gap constant-voltage circuit 420 and logic-chip power-supply circuit 450. The band-gap constant-voltage circuit 420 has NPN transistors Q11, Q12, Q13 and resistors R2, R3, R4.

A base and a collector of the transistor Q11 are connected, and the collector of this Q11 is connected to a node Nref via the resistor R2. An emitter of Q11 is connected to ground. To the base of Q11 is connected a base of the transistor Q12 having an emitter area that is a whole number multiple of the emitter area of Q11. An emitter of this Q12 is connected to ground via the resistor R4, and a collector of Q12 is connected to the node Nref via the resistor R3.

A base of the transistor Q13 is connected to a connection point between the collector of Q12 and the resistor R3, an emitter of this Q13 is connected to ground, and the collector is connected to the node Nref.

Incidentally, a constant-current supply 410 is provided between the band-gap constant-voltage circuit 420 and the power supply Vcc, and this constant-current supply 410 supplies a constant current to the band-gap constant-voltage circuit 420. Incidentally, between the constant-current supply 410 and ground there are provided a collector limiter constituted by an NPN transistor Q3, that adjusts the current amount in the constant-current supply 410, and a resistor R1.

The emitter area Ae2 of Q12 is set at a whole number multiple N of the emitter area Ae1 of Q11, and the bases of the two transistors are commonly connected. For this reason, the voltage difference ΔVbe between the voltage Vbe1 across the base and emitter of Q11 and the voltage Vbe2 across the base and emitter of Q12 is equal to the voltage generated in the resistor R4, and can be expressed by equation (1) below:

$$\Delta Vbe = Vbe1 - Vbe2 = (kT/q) \times \ln[(Ie1/Ae1)/(Ie2/Ae2)] = (kT/q) \times \ln[(Ie1/Ie2)N] \quad (1)$$

In equation (1), k is the Boltzmann constant, T is absolute temperature, q is the quantity of electric charge, Ie1 is the emitter current of Q11, and Ie2 is the emitter current of Q12.

The emitter current Ie2 of Q12 is expressed by equation (2) below:

$$Ie2 = \Delta Vbe/R4 \quad (2)$$

In equation (2), R4 is the resistance value of the resistor R4.

The voltage VR3 generated at both ends of the resistor R3 is expressed by equation (3) below:

$$VR3 = Ic2 \times R3 + Ib3 \times R3 \quad (3)$$

In equation (3), Ic2 is the collector current of Q12, and Ib3 is the base current of Q13. Supposing that the current amplification ratio $h_{FE}$ of the transistors used is sufficiently large and that the base current is negligible, equation (3) above can be expressed by equation (4) below:

$$VR3 = Ie2 \times R3 = R3/R4 \times \Delta Vbe \quad (4)$$

Hence, the voltage Vref in the node Nref becomes a voltage that is determined by equation (5) below:

$$Vref = Vbe3 + (R3/R4) \times \Delta Vbe = Vbe3 + (R3/R4) \times (kT/q) \times \ln[(Ie1/Ie2)N] \quad (5)$$

If the resistance value of the resistor R2 and the resistance value of the resistor R3 are made equal, then the collector current of Q11 and the collector current of Q12 become equal. If the current amplification ratio $h_{FE}$ of the two transistors is sufficiently large and each base current is negligible, then the emitter current of Q11 and the emitter current of Q12 become equal. Equation (5) is expressed by equation (6) below:

$$Vref = Vbe3 + (R3/R4) \times (kT/q) \times \ln[N] \quad (6)$$

As described above, in the band-gap constant-voltage circuit 420 the voltage Vref is prepared at the node Nref. Between this node Nref and ground, resistors R5, R6 are connected in this order as dividing resistors, and the resistance values of the resistors R5 and R6 are set so that the connection point between the resistor R5 and the resistor R6 provides a logic-chip power-supply voltage of 1.2 V aimed at in this embodiment.

The output node Nout that is the connection point between the resistors R5 and R6 is connected to the logic-chip power-supply circuit 450, and current amount is adjusted in this logic-chip power-supply circuit 450.

The logic-chip power-supply circuit 450 is provided with a differential part 454, by way of example, as shown in FIG. 3. The differential part 454 is provided with an NPN transistor Q20 whose base is connected to the output node Nout via a resistor R7, and an NPN transistor Q21 whose base is connected to a power-supply output node $N_{Vlogic}$ via a resistor R8. The emitters of the transistors Q20, Q21 are connected to a constant-current power supply 452, and the collector of the transistor Q20 is connected to a PNP transistor Q22 of a first current mirror circuit (hereinafter referred to as the first mirror circuit) 456 provided between Q20 and Vcc, both receiving a current supply. Also, the collector of the transistor Q21 is connected to the base and collector of a PNP transistor Q26 of a second current mirror circuit (hereinafter referred to as the second mirror circuit) 460 provided between Q21 and Vcc, receiving a current supply.

The collector of a PNP transistor Q23 on the output side of the above-described current mirror circuit 456 is connected to the base and collector of an NPN transistor Q24 of a third current mirror circuit (hereinafter referred to as the third mirror circuit) 458 provided between Q23 and the ground. A current equal to a current that is caused to flow by Q22 of the first mirror circuit 456 to Q2 of the differential part 454 flows through Q23, and this current is supplied to Q24 of the third mirror circuit 458. An NPN transistor Q25 on the output side of the third mirror circuit 458 is connected to a connection node Ng between a collector of a PNP transistor Q27 of the second mirror circuit and a gate of a PMOS transistor M1, and Q25 causes a current equal to the current of Q24 to flow toward ground.

On the other hand, a PNP transistor Q27 on the output side of the second mirror circuit causes a current equal to the current caused to flow by Q26, to which the base is commonly connected (the current supplied to Q21 of the differential part 454), to flow from Vcc toward the connection node Ng. Either the source or the drain of the above-described M1, whose gate is connected to this connection node Ng, is connected to Vcc, and the other is connected to the power-supply output node $N_{Vlogic}$. A resistor R9 is connected between this power-supply output node $N_{Vlogic}$ and ground.

The voltage of the connection node Ng is adjusted by the current supplied from the second mirror circuit 460 and the current extracted by the third mirror circuit 458. The PMOS transistor M1 acts in response to the voltage of the connection node Ng, the current flowing through this PMOS transistor M1 flows through the resistor R9, and the voltage of the power-supply output node OUT is determined. This power-supply output node $N_{Vlogic}$ is negatively fed back to the base of the transistor Q21 of the differential part 454 via the resistor R8. Therefore, if the resistor R8 and the resistor R7 have the same resistance value, the logic-chip power-supply circuit 450 operates so that the voltage in the power-supply output node $N_{Vlogic}$ becomes equal to the voltage of the output node Nout from the band-gap constant-voltage circuit 420.

This power-supply output node $N_{Vlogic}$ corresponds to a logic power-supply output terminal ($T_{Vout}$) of the driver chip 20, and the prepared logic power supply is supplied to a logic input terminal $T_{Vin}$ of the logic chip 30 provided within the same package, as shown in FIGS. 1 and 2.

Figure 6:
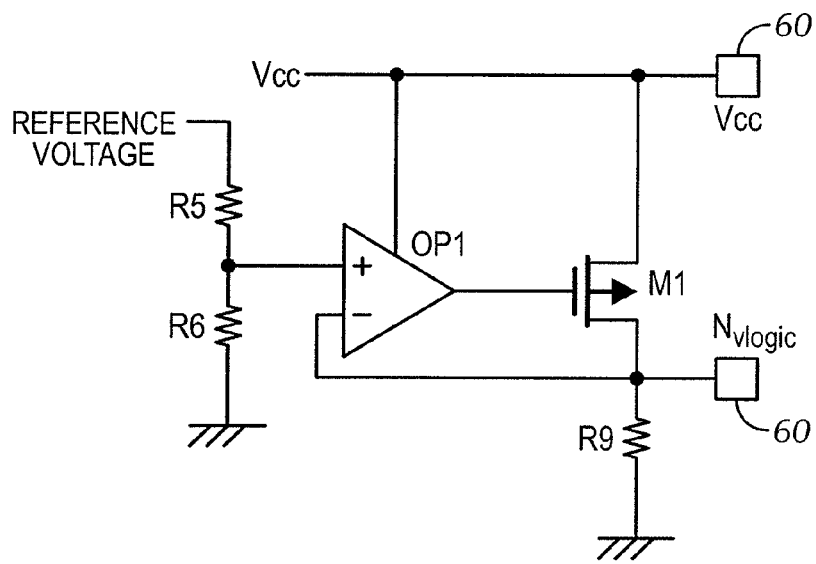
FIG. 6 is a diagram showing the schematic configuration of the power-supply circuit for a logic chip.

Incidentally, the amplification rate of the logic-chip power-supply circuit 450 becomes 1 if the resistor R7 and the resistor R8 have the same resistance value. The resistors R7 and R8 can be omitted. The circuit in this case is shown in FIG. 6. In this manner, the voltage of the output (the node $N_{Vlogic}$) on the upper side of the resistor R9 is negatively fed back to the operational amplifier, whereby the input voltage and the output voltage become equal and a sufficient output is supplied from the output transistor M1 to the terminal ($N_{Vlogic}$).

A Vcc low-voltage cut circuit 430 is connected to the above-described node Nref, and this Vcc low-voltage cut circuit 430 turns off the transistor M1 in order to prevent the output voltage $T_{Vout}$ from dropping when the Vcc voltage drops from a prescribed voltage at Vcc start, during a Vcc drop due to discharge of a battery and the like. Also an overheat protection circuit 440 is connected to the node Nref. In the case of overheating in the band-gap constant-voltage circuit 420, this overheat protection circuit 440 protects the power-supply circuit by stopping the operation of the transistor M1, which constitutes a heat source. In the example of FIG. 3, the Vcc low-voltage cut circuit 430 and the overheat protection circuit 440 control the gate (Ng) potential of the transistor M1 through a current control wiring path, which is not shown. As a result of this, the operation of M1 is stopped and it is possible to protect the power-supply circuit and circuits receiving power from this power supply, and to stabilize the output voltage. When a power-supply circuit using a band-gap constant-voltage circuit for the driver chip 20 is provided within the driver chip, in this driver-chip power-supply circuit also, the protection of these power-supply circuits may be performed by using the same above-described Vcc low-voltage cut circuit 430 and overheat protection circuit 440.

What is claimed is:

1. A multi-chip package semiconductor device in which a plurality of chips are mounted within the same package, including:
    a driver chip having an analog circuit; and
    a logic chip having a digital circuit, wherein
    the driver chip includes a logic-chip power-supply circuit that makes up a logic-chip power supply for the logic chip and a plurality of operational amplifiers that amplify detection signals from a plurality of sensors, and wherein
    the driver chip has the shape of a square as a whole, and the plurality of operational amplifiers and the logic-chip power-supply circuit are disposed in diagonally opposed positions.

2. The semiconductor device according to claim 1, wherein a logic-chip power-supply output terminal for outputting the logic-chip power supply is disposed in the vicinity of the logic-chip power-supply circuit.

3. The semiconductor device according to claim 1, further including a band-gap reference voltage generating circuit that generates a reference voltage supplied to the logic-chip power supply, wherein the band-gap reference voltage generating circuit is disposed between the plurality of operational amplifiers and the logic-chip power supply.

4. The semiconductor device according to claim 1, wherein the plurality of operational amplifiers include a hole amplifier that amplifies signals from a hole element provided outside the semiconductor device.

5. The semiconductor device according to claim 4, wherein the logic-chip power-supply output terminal for outputting the logic-chip power supply and the hole amplifier are disposed in diagonally opposed positions.

* * * * *